United States Patent [19]

Barile et al.

[11] 4,243,435
[45] Jan. 6, 1981

[54] BIPOLAR TRANSISTOR FABRICATION PROCESS WITH AN ION IMPLANTED EMITTER

[75] Inventors: Conrad A. Barile, Wappingers Falls; Goerge R. Goth, Poughkeepsie; James S. Makris; Arunachala Nagarajan, both of Wappingers Falls; Raj K. Raheja, Hopewell Junction, all of N.Y.

[73] Assignee: International Business Machines Corporation, Armonk, N.Y.

[21] Appl. No.: 51,078

[22] Filed: Jun. 22, 1979

[51] Int. Cl.³ .................. H01L 21/22; H01L 21/26
[52] U.S. Cl. ..................................... 148/1.5; 148/187; 357/34; 357/91
[58] Field of Search .............. 148/1.5, 187; 357/34, 357/15, 91

[56] References Cited

U.S. PATENT DOCUMENTS

| 3,604,986 | 9/1971 | Lepselter et al. | 317/235 |
| 3,837,936 | 9/1974 | Kraft | 148/187 |
| 3,928,081 | 12/1975 | Marley, Jr. et al. | 148/1.5 |
| 3,928,082 | 12/1975 | Schwettmann et al. | 148/1.5 |
| 3,945,856 | 3/1976 | Koenig et al. | 148/1.5 |
| 4,018,627 | 4/1977 | Polata | 148/1.5 |
| 4,046,606 | 9/1977 | Lambert | 148/187 |
| 4,106,954 | 8/1978 | De Brebisson et al. | 148/1.5 |
| 4,118,250 | 10/1978 | Horng et al. | 148/1.5 |
| 4,131,497 | 12/1978 | Feng et al. | 148/187 |
| 4,135,954 | 1/1979 | Chang et al. | 148/187 |

OTHER PUBLICATIONS

Horng et al., "HIgh Performance Bipolar Transistor...", IBM-TDB, 21 (1979), 3202.
Barile et al., "Implanted Emitter Process...", IBM-TDB, 18 (1975), 2177.
Doulin et al., "Fabricating Ion-Implanted Regions...", IBM-TDB, 19 (1977), 3407.
Lee, "Bipolar Transistor... Process", IBM-TDB, 20 (1977), 1753.

Primary Examiner—L. Dewayne Rutledge
Assistant Examiner—Upendra Roy
Attorney, Agent, or Firm—David M. Bunnell

[57] ABSTRACT

A very high current ion implanted emitter is formed in a diffused base. Windows are made through the silicon nitride and silicon dioxide layes to both the base contact and the emitter regions using a resist mask. These regions are then protected by resist and the collector contact window is opened through the remainder of the silicon dioxide layer to the reach through region. A screen oxide is then grown in all the exposed areas after the removal of the resist mask. A resist mask is applied which covers only the base and Schottky anode regions. Arsenic is then implanted through the exposed screened areas followed by an etch back step to remove the top damaged layer. With some remaining screen oxide serving as a cap, the emitter drive-in is done.

26 Claims, 7 Drawing Figures

BIPOLAR TRANSISTOR FABRICATION PROCESS WITH AN ION IMPLANTED EMITTER

BACKGROUND OF THE INVENTION

The present invention relates to the formation of ion-implanted emitters in transistor integrated circuits and more particularly to a high current implantation process through a screen oxide layer which eliminates damages and contamination caused by high current implantation. The process avoids nitride overhang so that passivation of the emitter/base junction is achieved.

Ion implantation through a screen oxide layer into a semiconductor substrate to form impurity regions is described, for example, in U.S. Pat. No. 3,945,856. The oxide layer has a thickness of from 100 to 1,000 Å and contaminating ions from the ion implantation equipment are trapped in the upper portion of the oxide layer. The upper portion is generally damaged. This portion of the oxide layer is etched away prior to the high heat drive-in step so that the contaminants are not diffused into the substrate.

Ion implantation of emitters into a diffused base has the advantage over a diffusion process in that the impurity dosage can be closely controlled to within 1-2% obtaining tight parametric distributions, and performance enhancement, so that device yield should increase. A problem arises, however, with proper passivation of the emitter/base junction because of the nitride overhang and directionality of the implant which confines the implanted area to the opening in the mask. Therefore, if the passivating layer is undercut beneath the mask opening, the layer will not properly overlap the implanted emitter/base junction at the surface of the substrate and device yields are reduced. This undercutting occurs when etching through composite layers of silicon nitride and silicon oxide to open the emitter area where a difference in the thickness of the oxide layer between collector and emitter requires an overetch of the emitter opening in order to remove a thicker oxide layer portion over, for example, a collector or Schottky barrier diode contact region.

The problem of undercutting has been previously addressed in the IBM Technical Disclosure Bulletin article, "Fabricating Ion Implanted Regions in Semiconductors" by J. Doulin et al. Vol. 19, No. 9, February 1977, pages 3407–3408 and "Implanted Emitter Process For Semiconductor Transistor" by C. Barile et al., Vol. 18, No. 7, December 1975, pages 2177–2178. In the Doulin et al. article undercutting is "minimized" by stripping the oxide layer over the collector and then regrowing the oxide. This still results in a differential in oxide thickness over the emitter and collector contact regions so that some overetch of the emitter region is still needed to open the collector contact regions. In the Barile et al. article, undercutting is avoided by using an etchant for the oxide which also attacks the overlying nitride. This eliminates nitride overhang but at the expense of enlarging the emitter and contact openings. Alternatively, reactive ion etching is employed to etch the oxide.

However, because of the non-selectivity of this type of etch, where different oxide thicknesses must be etched, the overetch of the emitter opening needed to open the collector contact can result in attack of the semiconductor surface by the reactive ion etch process leading to severe pipe problems.

SUMMARY OF THE INVENTION

We have now discovered a process which avoids undercutting without requiring oxide stripping, extra masking steps or the use of etchants which attack the nitride or substrate and which is compatible with existing diffused device formation processes. The process also employs a high dose rate ion implantation through a thin screen oxide layer to provide a high yield of transistor integrated circuits, and tight parametric control and enhanced performance.

In accordance with this invention, there is provided a process for forming a transistor integrated circuit in which a diffusion mask is covered by a patterned resist layer and etched to open the emitter and base contact regions. At the same time, the mask over the collector region is only etched through part of its thickness. The resist layer is removed. A second patterned resist layer is formed which protects the emitter and base openings and the remainder of the mask over the collector region is etched to open the collector region. The second resist layer is removed and a thin protective layer is formed at least over the emitter opening. A third patterned resist layer is formed which covers the base opening but which leaves the emitter opening exposed. Impurities are then introduced through the emitter opening by ion implantation.

DETAILED DESCRIPTION OF THE PREFERRED EMBODIMENT

Figure 1:
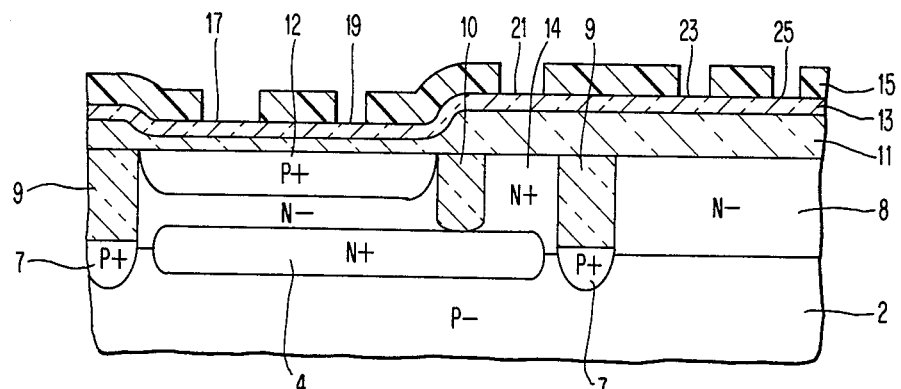
FIGS. 1, 2, and 4–7 are diagrammatic partial sections of a portion of an integrated circuit at various fabrication stages in order to illustrate the practice of the preferred embodiments of the present invention.

FIG. 1 illustrates a partially-completed integrated circuit which includes epitaxial layer 8 on N− conductivity type which has been deposited atop P− silicon semiconductor substrate 2. Subcollector region 4 and P+ isolation region 7 have outdiffused into epitaxial layer 8. Preferably, layer 8 has a thickness of around 2 microns or less and an impurity concentration of from 2.0 to $2.2 \times 10^{16}$ atoms per $cm^3$. Substrate 2 typically has a resistivity of 10 ohm cm. Regions 4 and 7 are advantageously formed by the standard process of diffusing said regions into windows in a masking layer which expose portions of the bare substrate 2. Typical N+ impurities are arsenic or phosphorus; a typical P+ impurity is boron.

The masking layer is then stripped from substrate 2 by conventional etching techniques and layers 8 is grown epitaxially, thereby causing regions 4 and 7 to out-diffuse into layer 8.

Epitaxial layer 8 also includes recessed oxide isolation regions 9 and 10 which separate the various regions of the devices to be formed within layer 8. These include an N+ subcollector reachthrough region 14, and a P type base region 12.

Isolation regions 9 and 10 are formed by etching trenches into epitaxial layer 8. An appropriate mask such as a composite of silicon dioxide/silicon nitride covers the remainder of the substrate wherein the trenches are not to be formed. The trenches are then etched either by wet chemical etching techniques or by reactive ion etching. The trenches are then filled with silicon dioxide in the known manner using dry oxygen or a combination of steam and oxygen or both. Alternatively, silicon dioxide could be deposited in the trenches rather than thermally grown. Base region 12 is then formed by diffusion.

The structure is covered by a layer of silicon dioxide 11 and a layer of silicon nitride 13. The silicon dioxide layer is about (2,000 to 3,600) angstroms thick over the reach-through and Schottky barrier diode regions but only about (800 to 2,000) angstroms thick where it has been regrown over the base region 12. The silicon nitride layer thickness is about 1600 angstroms. A 1 micron thick layer of photoresist 15, for example Shipley AZ-1350J positive photoresist, is then applied and patterned by standard lithographic techniques to expose layer 13 in the regions where the emitter 17, the base contact 19 and collector contact 21 and the Schottky barrier anode 23 and cathode 25 are to be formed.

Figure 2:
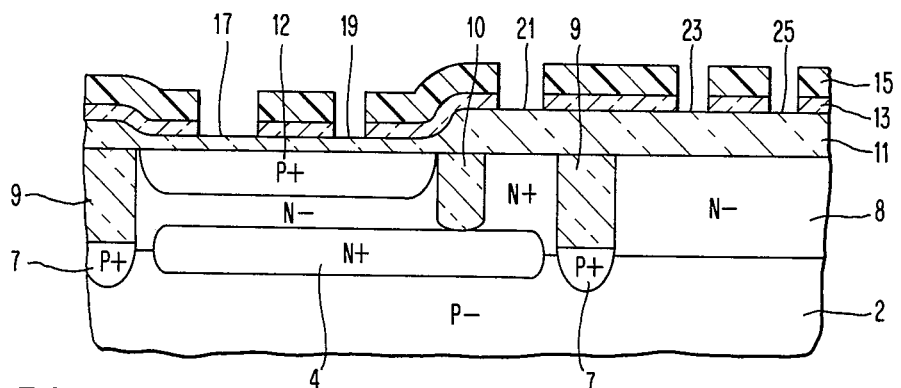

The exposed areas of silicon nitride layer 13 are then etched down to the silicon dioxide, either by wet etching or by reactive ion etching in a $CF_4$ containing atmosphere as illustrated in FIG. 2.

Figure 3:
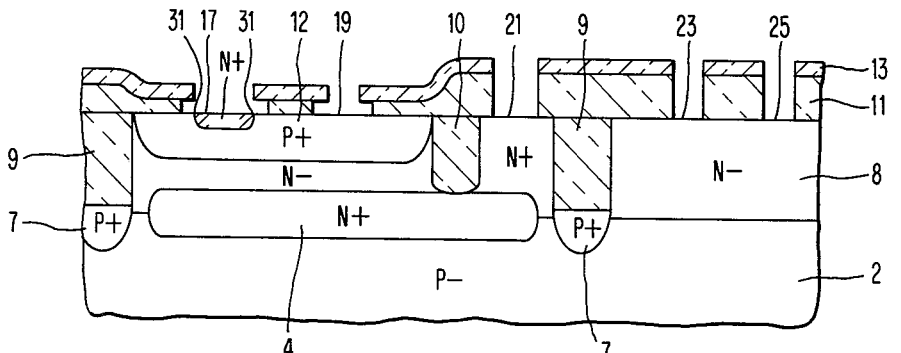
FIG. 3 is a diagrammatic partial section of a portion of an integrated circuit illustrating a passivation problem which occurs in the practice of a prior art process.
Figure 4:
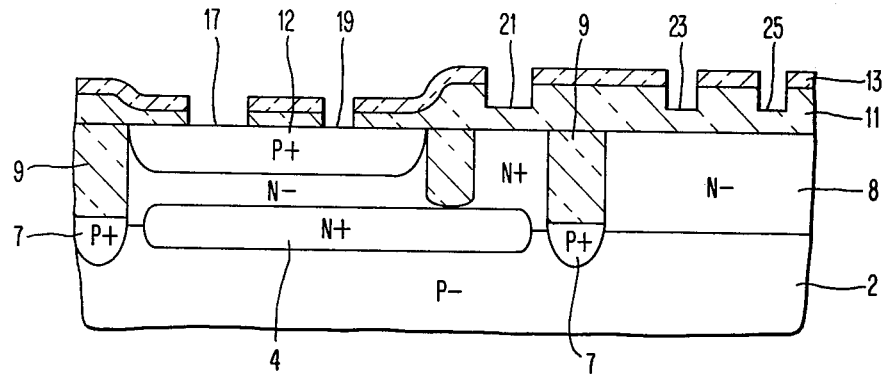
Figure 5:
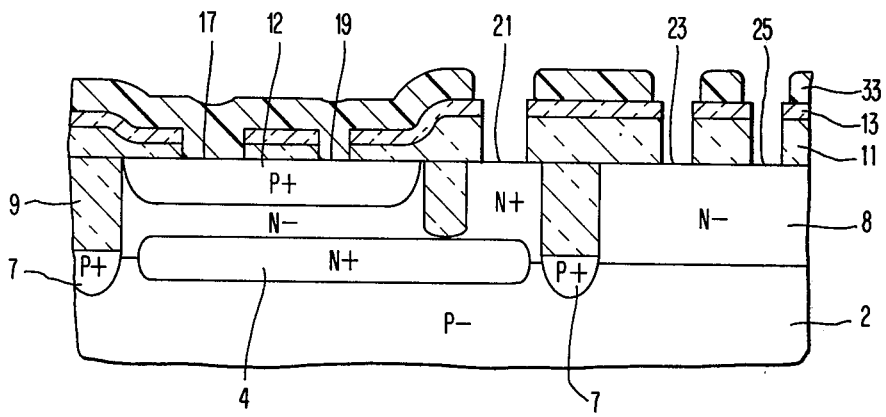
Figure 6:
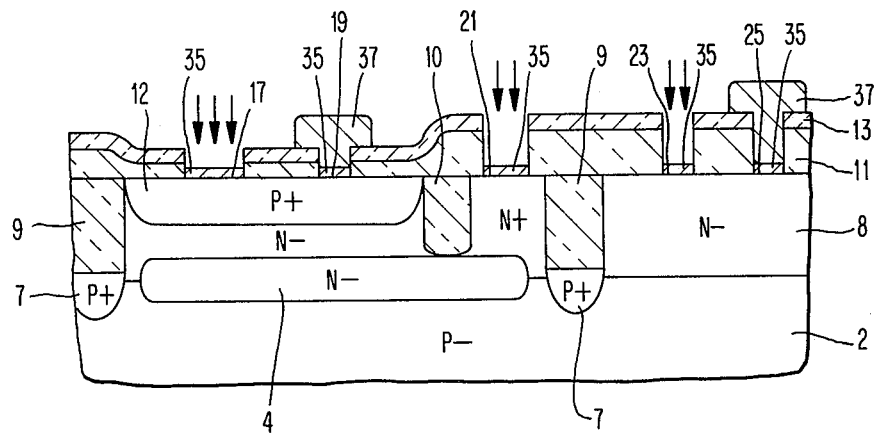
Figure 7:
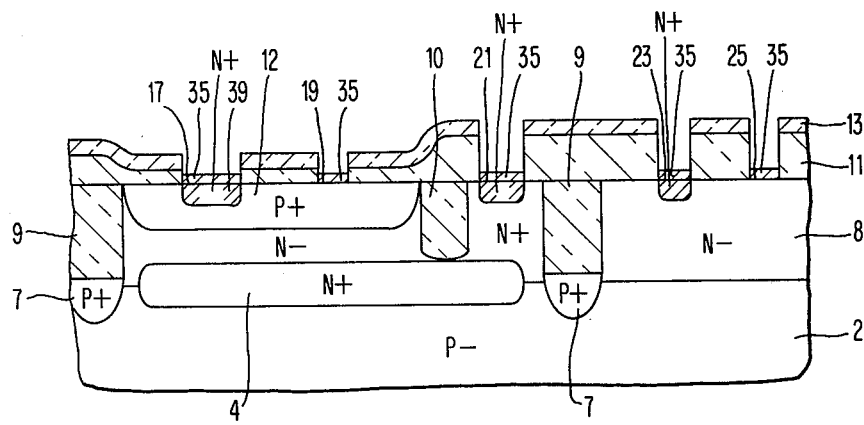

The foregoing is conventional practice and normally the resist layer would then be stripped and a new resist layer applied and patterned to expose the areas of oxide layer for etching in order to open up the N contact areas (emitters, collector, and cathode of the Schottky). Because of the approximately 1,200 angstroms difference in oxide layer thickness, overetch of the emitter area occurs before the collector and Schottky are opened which causes undercutting of the oxide at the emitter opening as shown in FIG. 3. The nitride layer overhangs the oxide. This would not present a problem with a diffused emitter because the diffusion will spread laterally so that the junction at the surface is covered with oxide. However, because the ion implantation occurs in a direction normal to the substrate, the ions are masked by the nitride and do not reach the region of the substrate under the overhanging nitride so that the emitter base junction 31 may not be properly passivated as shown in FIG. 3. Therefore, in the process of the invention, resist layer 15 is retained after the nitride etch. About 800 angstroms of silicon dioxide is then wet etched in buffered hydrofluoric acid to open the emitter 17 and base contact down to the silicon surface, without overetch, while partially removing the silicon dioxide over the collector contact 21 and the Schottky anode 23 and cathode 25. The resist 15 is then stripped to produce the structure illustrated in FIG. 4. Resist layer 33 (FIG. 5) is then applied and patterned to protect the emitter 17 and base contact 19 areas and expose the oxide over collector contact 21 and the Schottky anode 23 and cathode 25. The remaining 1200 angstroms of oxide are then etched in buffered hydrofluoric acid down to the silicon as illustrated in FIG. 5. Resist layer 33 is then stripped and the structure is cleaned by immersing it in 10:1 buffered hydrofluoric acid for about thirty seconds. A thin (200–1,000 Å), preferably about 250 Å thick, screen silicon dioxide layer 35 (FIG. 6) is then grown or deposited in each of the previously described openings in the oxide layer. Screen oxide layer 35 is preferably thermally grown from epitaxial layer 8 in dry oxygen at a temperature of about 925° C. for about 50 minutes. As an alternative to thermal growth, oxide layer 35 could also be formed by conventional vapor deposition techniques. For example, a silicon dioxide layer can be deposited pyrolytically in a chamber containing silane, carbon dioxide and hydrogen at a temperature of about 1,000° C. for about two minutes. Thereafter, a resist mask 37 is formed by lithographic techniques to expose only the emitter 17, collector contact 21 and Schottky cathode 23 regions (FIG. 7).

The resist is treated so that it will not flow during ion implantation such as by a brief exposure to a plasma containing $CF_4$ as described in copending application Ser. No. 936,425 filed Aug. 24, 1978. Next the emitter, collector contact and Schottky cathode regions are implanted with N type impurity atoms of arsenic or phosphorous. Preferred in the process is a high energy, 50 kv (range 40 to 60 kv), ion implant of arsenic at a nominal dose of $9.5 \times 10^{15}$ atoms/cm$^2$ at a current of about 2 milliamps (range 1.8 to 2.2 ma). The dose is tailored to the desired characteristics of the device being formed and can range from about $8.5 \times 10^{15}$ to $10 \times 10^{15}$ atoms/cm$^2$. The implantation takes about 2 to 3 minutes. The resist mask 37 is then stripped.

The screen oxide at the ion implant energy of 50 KeV and 2 ma current, besides acting as a damage inhibitor for the silicon surface, also traps a considerable portion of the implanted impurity. It is very essential to control the screen thickness accurately to within ±10% to assure parametric distributions. The screen oxide layer ties up the damage in the first several hundred angstroms in the silicon. The screen oxide in the first 100–150 Å also traps any metallic contaminants which are generated from the implantation apparatus materials. Accordingly, to prevent damage or contamination from propagating into the silicon during the thermal drive-in step, the top 100–150 Å portion of the screen oxide is removed by a dip etch in buffered hydrofluoric acid (40/1) for about 30 seconds. The structure is then heated stepwise to drive the impurities into the epitaxial layer and for emitter 39 in the time temperature sequence of 805° C. for 10 minutes, 1,000° C. for 69–72 minutes, and 825° C. for 10 minutes. The screen oxide acts as a cap during the drive in to minimize arsenic loss. The remaining screen oxide is then removed by dipping in buffered HF (40/1) for about 1 minute and 20 seconds. The process of forming the contact and interconnecting metallurgy is then carried out in a conventional manner to complete the integrated circuits.

The process results in transistor integrated circuit devices with improved device characteristics, improved emitter-collector leakage limited yield and improved Schottky barrier diode limited yield. Unlike a diffused process sequence, the ion implanted emitter process has a photoresist masking the implant so that N+ diffusion into the active Schottky anode regions with consequent parallel resistor formation is avoided. The leakage limited yield topography is also opposite to that of the diffused case with less plastic deformation occurring in the central portion of the wafer compared to the outer edges.

Dry etching of nitride in the diffused emitter case opens up the silicon surface through the pinhole in the oxide, causing N+ to get into the SBD anode regions causing a parallel resistor problem.

Having thus described my invention, what I claim as new, and desire to secure by Letters Patent is:

1. A method of forming semiconductor devices in a semiconductor substrate comprising;
    forming emitter and base contact windows through a mask on said substrate and a collector contact window partially through said mask while protecting the remainder of said mask with a resist layer, said mask being thicker in the region of the collector contact than in the region of the emitter window;

removing said resist layer, forming the remainder of the collector contact window through said mask while protecting said emitter and base contact windows with a second resist layer;

removing said second resist layer;

forming a thin protective layer over at least said emitter window;

forming a third resist layer which covers said base window and leaves said emitter window exposed, and;

introducing impurities through said emitter window by ion implantation.

2. The method of claim 1 wherein said mask is a composite layer of silicon dioxide under silicon nitride and the silicon dioxide is thicker in the region of the collector contact than in the region of the emitter window.

3. The method of claim 1 wherein said thin protective layer is silicon dioxide.

4. The method of claim 1 wherein said impurity is arsenic.

5. The method of claim 1 wherein the ion implantation is a high energy 40 to 60 kv high dose rate 1.8 to 2.2 ma current implantation for a time to provide a dosage of from about $8.5 \times 10^{15}$ to $10 \times 10^{15}$ atoms/cm$^2$.

6. The process of claim 1 including the steps of removing the top portion of the protective layer following ion implantation and then heating the substrate to drive-in the impurity.

7. The method of claim 2 wherein the emitter and base contact window are formed by etching through the silicon nitride by reactive ion etching and through the silicon dioxide by wet etching and the collector contact window is partially formed at the same time by etching through the silicon nitride by reactive ion etching and partially through the silicon dioxide by wet etching.

8. The method of claim 5 wherein the energy is about 50 kv, the current about 2 ma, and the dosage about $9.5 \times 10^{15}$ arsenic atoms/cm$^2$.

9. The process of claim 6 including the steps of removing the remaining protective layer after drive-in.

10. The method of claim 3 wherein said thin protective layer has a thickness of about 200 to 1,000 Å with tolerances of ±10% around the nominal of 250 Å.

11. The method of claim 7 wherein the reactive ion etching is in a CF$_4$ containing atmosphere and the wet etch contains aqueous hydrofluoric acid.

12. The method of claim 7 where the remainder of the collector contact window is formed by a wet etch containing aqueous hydrofluoric acid.

13. The method of claim 10 wherein said protective layer has a thickness of about 250 Å.

14. A method of forming semiconductor devices in a semiconductor substrate comprising;

forming emitter and base contact windows through a mask on said substrate and a collector and Schottky barrier diode anode and cathode contact windows partially through said mask while protecting the remainder of said mask with a resist layer, said mask being thicker in the region of the collector and Schottky barrier anode and cathode contact windows than in the region of the emitter window;

removing said resist layer, forming the remainder of the collector contact window and the Schottky barrier diode anode and cathode contact windows through said mask while protecting said emitter and base contact windows with a second resist layer;

removing said second resist layer;

forming a thin protective layer over at least said emitter window;

forming a third resist layer which covers said base and Schottky barrier diode anode windows and leaves said emitter and Schottky barrier diode cathode windows exposed, and;

introducing impurities through said emitter window and said Schottky barrier diode cathode contact window by ion implantation.

15. A method of forming semiconductor devices in a semiconductor substrate comprising;

forming emitter and base contact windows through a mask on said substrate and a collector and Schottky barrier diode anode and cathode contact windows partially through said mask while protecting the remainder of said mask with a resist layer, said mask comprising a composite layer of silicon dioxide under silicon nitride, the silicon dioxide being thicker in the region of the collector and Schottky barrier anode and cathode contact windows than in the region of the emitter window;

removing said resist layer, forming the remainder of the collector contact window and the Schottky barrier diode anode and cathode contact windows through said mask while protecting said emitter and base contact windows with a second resist layer;

removing said second resist layer;

forming a thin protective layer over at least said emitter window;

forming a third resist layer which covers said base and Schottky barrier diode anode windows and leaves said emitter and Schottky barrier diode cathode windows exposed, and;

introducing impurities through said emitter window and said Schottky barrier diode cathode contact window by ion implantation.

16. The method of claim 15 wherein the emitter and base contact window are formed by etching through the silicon nitride by reactive ion etching and through the silicon dioxide by wet etching and the collector Schottky barrier anode and cathode contact windows are partially formed at the same time by etching through the silicon nitride by reactive ion etching and partially through the silicon dioxide by wet etching.

17. The method of claim 16 wherein the reactive ion etching is in a CF$_4$ containing atmosphere and the wet etch contains aqueous hydrofluoric acid.

18. The method of claim 16 where the remainder of the collector and Schottky barrier diode anode and cathode contact windows are formed by a wet etch containing aqueous hydrofluoric acid.

19. The method of claim 15 wherein said thin protective layer is silicon dioxide.

20. The method of claim 19 wherein said thin protective layer has a thickness of about 200 to 1,000 Å.

21. The method of claim 20 wherein said protective layer has a thickness of about 250 Å.

22. The method of claim 15 wherein said impurity is arsenic.

23. The method of claim 14 wherein the ion implantation is a high energy 40 to 60 kv high dose rate 1.8 to 2.2 ma current implantation for a time to provide a dosage of from about $8.5 \times 10^{15}$ to $10 \times 10^{15}$ atoms/cm$^2$.

24. The method of claim 23 wherein the energy is about 50 kv, the current about 2 ma, the dosage about $9.5 \times 10^{15}$ arsenic atoms/cm$^2$.

25. The process of claim 15 including the steps of removing the top portion of the protective layer following ion implantation and then heating the substrate to drive-in the impurity.

26. The process of claim 25 including the steps of removing the remaining protective layer after drive-in.

* * * * *